US011507722B2

United States Patent
Chan et al.

(10) Patent No.: US 11,507,722 B2
(45) Date of Patent: *Nov. 22, 2022

(54) METHOD AND APPARATUS FOR PERFORMING INCREMENTAL COMPILATION USING STRUCTURAL NETLIST COMPARISON

(71) Applicant: Altera Corporation, San Jose, CA (US)

(72) Inventors: Kevin Chan, Scarborough (CA); Mark Bourgeault, Mississauga (CA)

(73) Assignee: Altera Corporation, San Jose, CA (US)

( * ) Notice: Subject to any disclaimer, the term of this patent is extended or adjusted under 35 U.S.C. 154(b) by 83 days.

This patent is subject to a terminal disclaimer.

(21) Appl. No.: 16/375,620

(22) Filed: Apr. 4, 2019

(65) Prior Publication Data

US 2019/0251220 A1 Aug. 15, 2019

Related U.S. Application Data

(63) Continuation of application No. 12/655,840, filed on Jan. 8, 2010, now Pat. No. 10,275,557.

(51) Int. Cl.
*G06F 30/34* (2020.01)
*G06F 30/30* (2020.01)
*G06F 16/901* (2019.01)

(52) U.S. Cl.
CPC .............. *G06F 30/34* (2020.01); *G06F 30/30* (2020.01); *G06F 16/9017* (2019.01)

(58) Field of Classification Search
CPC ........ G06F 30/30; G06F 30/34; G06F 30/323; G06F 30/327; G06F 30/3323; G06F 16/9017; G06F 2219/16; G06F 2219/20; G06F 30/20; G06F 30/33; G06F 30/39
USPC ................. 716/107, 116–117, 103, 139, 126
See application file for complete search history.

(56) References Cited

U.S. PATENT DOCUMENTS

| | | | | |
|---|---|---|---|---|
| 5,875,112 A * | 2/1999 | Lee | ......................... | G06F 30/30 716/107 |
| 6,557,144 B1 * | 4/2003 | Lu | ......................... | G06F 30/392 716/122 |
| 7,171,644 B1 * | 1/2007 | Laurence | ................. | G06F 30/30 716/105 |
| 7,191,426 B1 * | 3/2007 | Singh | ...................... | G06F 30/34 716/104 |
| 7,984,415 B1 * | 7/2011 | Srinivasan | ............ | G06F 30/327 716/139 |
| 2009/0288059 A1 * | 11/2009 | Dimou | .................... | G06F 30/35 716/104 |
| 2010/0058269 A1 * | 3/2010 | Baker | ................... | G06F 30/327 716/122 |

* cited by examiner

*Primary Examiner* — Paul Dinh
(74) *Attorney, Agent, or Firm* — Fletcher Yoder, P.C.

(57) ABSTRACT

A method for designing a system on a target device includes identifying portions in the system to preserve based on comparing structural characteristics of the system with another system. Design results from the another system are reused for portions in the system that are preserved.

7 Claims, 9 Drawing Sheets

METHOD AND APPARATUS FOR PERFORMING INCREMENTAL COMPILATION USING STRUCTURAL NETLIST COMPARISON

CROSS REFERENCE TO RELATED APPLICATION

This is a continuation of U.S. patent application Ser. No. 12/655,840 filed on Jan. 8, 2010, entitled "METHOD AND APPARATUS FOR PERFORMING INCREMENTAL COMPILATION USING STRUCTURAL NETLIST COMPARISON," now U.S. Pat. No. 10,275,557, issued Apr. 30, 2019, the entirety of which is hereby incorporated by reference for all purposes.

TECHNICAL FIELD

The present invention relates to electronic design automation tools for designing systems on target devices. More specifically, the present invention relates to a method and apparatus for performing incremental compilation using structural netlist comparison at multiple points in the compilation flow which would enable transformations over time.

BACKGROUND

Target devices such as field programmable gate arrays (FPGAs), structured application specific integrated circuits (ASICs), and ASICs are used to implement large systems that may include million of gates and megabits of embedded memory. The complexity of large systems often requires the use of electronic design automation (EDA) tools to create and optimize a design for the system onto physical target devices. Among the procedures performed by EDA tools in a computer aided design (CAD) flow are synthesis, placement, and routing. When designing large systems to be implemented on large target devices, EDA tools may require a large amount of time to perform these compilation procedures.

When making changes to large systems, it is typically more common for designers to modify localized portions of a design rather than making radical changes to large portions of the system. When making such localized changes, it is undesirable to have the EDA tool process the entire system from scratch because the designer may be satisfied with the results of unmodified portions of the system and re-processing the unmodified portions may change the design unfavorably. Furthermore, changes made to one part of a system may affect another part of the system. This is known as the "seed" effect. In addition, a large amount of time would be required to process the entire circuit from scratch.

Incremental compilation is a design methodology that involves re-processing only modified portions of a system. Previously determined design results are used for unmodified or "preserved" portions of the system.

SUMMARY

According to an embodiment of the present invention, a procedure for comparing a first netlist for a first system that has been compiled and a second netlist for a second system to be compiled is used. The procedure compares the connectivity and structure of nodes in the netlists, as well as atom properties such as names and port types, to identify portions in the second system to preserve. Design results from the first system may be reused for preserved portions of the second system. Reusing preserved portions may involve applying constraints to the compilation of the second system such that the design results for the preserved portions of the second system will be similar to the design results of the first system. The procedure may also transform parts of the second netlist to reflect optimizations of the first netlist. The optimizations may include wire look up table (LUT) insertion, LUT rotation, and node duplication. According to an embodiment of the present invention, the procedure notifies a designer (user) about the portions of the second system identified to be preserved and/or portions of the second system that represent modifications to the first system. In this embodiment, the procedure allows the designer to determine whether to have the second system reuse the design results from the first system. Alternatively, the procedure may have the second system automatically reuses all the design results from the first system corresponding to portions to be preserved. The procedure may also be extended to accept input from the designer.

BRIEF DESCRIPTION OF THE DRAWINGS

The features and advantages of the present invention are illustrated by way of example and are by no means intended to limit the scope of the present invention to the particular embodiments shown.

DETAILED DESCRIPTION

In the following description, for purposes of explanation, specific nomenclature is set forth to provide a thorough understanding of embodiments of the present invention. However, it will be apparent to one skilled in the art that specific details in the description may not be required to practice the embodiments of the present invention. In other instances, well-known components, programs, and procedures are shown in block diagram form to avoid obscuring embodiments of the present invention unnecessarily.

Figure 1:
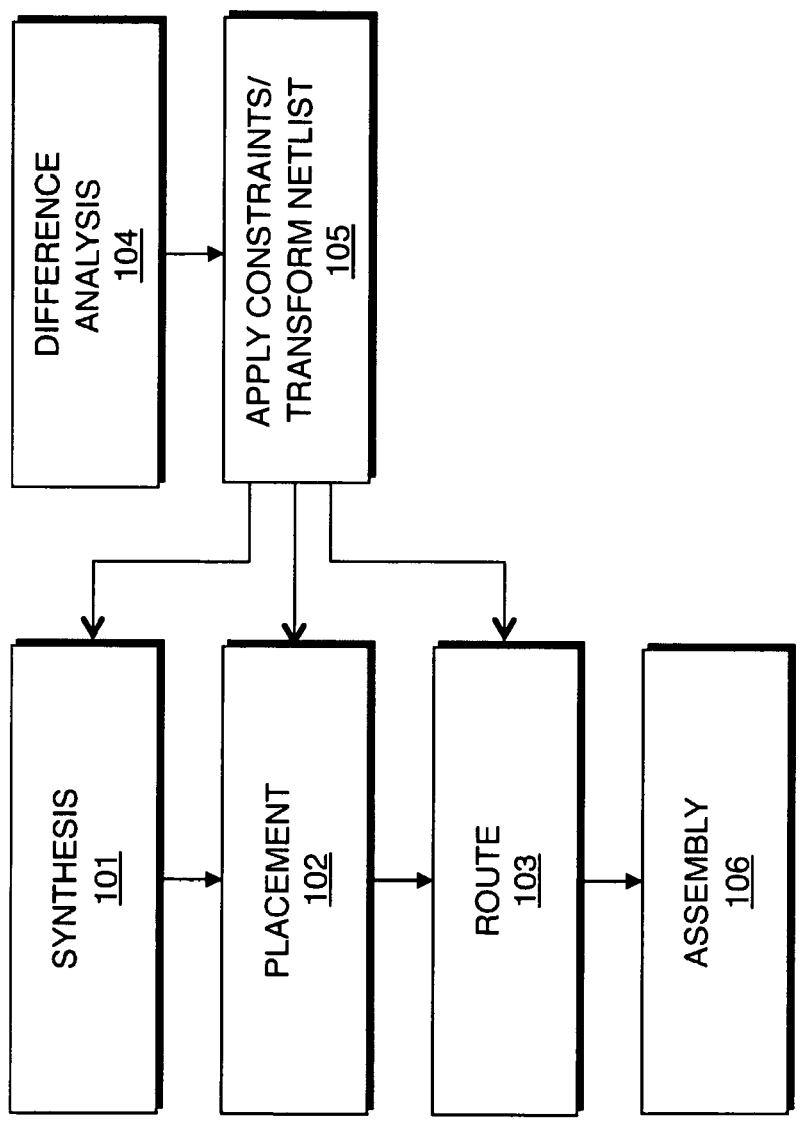
FIG. 1 is a flow chart illustrating a method for designing a system on a target device using incremental compilation according to an embodiment of the present invention.

FIG. 1 is a flow chart illustrating a method for designing a system on a target device using incremental compilation according to an embodiment of the present invention. The target device may be an FPGA, ASIC, a structured ASIC, or other device. According to an embodiment of the present invention, the methodology described with reference to FIG. 1 may be performed by an EDA tool. Each of the procedures in FIG. 1 may be performed automatically by the EDA tool without user intervention. At 101, the system is synthesized. Synthesis includes generating a logic design of the system to be implemented by a target device. According to an embodiment of the present invention, synthesis generates an optimized logical representation of the system from an HDL design definition. Synthesis also includes mapping the optimized logic design. Mapping includes determining how to implement logic gates and logic elements in the optimized logic representation with specific resources on the target device. According to an embodiment of the present invention, a netlist is generated from mapping. This netlist may be an optimized technology-mapped netlist generated from the HDL.

At 102, the system is placed. According to an embodiment of the present invention, placement involves placing the mapped logical system design on the target device. Placement works on the optimized technology-mapped netlist to produce a placement for each of the functional blocks. According to an embodiment of the present invention, placement includes fitting the system on the target device by determining which resources on the target device are to be used for specific logic gates and logic elements in each functional block. The placement procedure may implement clustering where a proper subset of logic gates and logic elements of functional blocks are grouped together in clusters. The clusters are assigned to specific positions on the target device. It should be appreciated that prior to placement a pre-fitting procedure may be implemented where template register packing, input output (IO) and memory placement, and other tasks may be performed.

At 103, it is determined which routing resources should be used to connect the components in the target device implementing the functional blocks in the system. During routing, routing resources on the target device are allocated to provide interconnections between logic gates, logic elements, and other components on the target device. It should be appreciated that after routing a post-fitting procedure may be implemented where delay chain values are set and other simple modifications may be made to the system design.

According to an embodiment of the present invention, after running procedures 101-103, changes may be made to the original HDL design definition of the system. Instead of processing the entire HDL design definition of the modified system with procedures 101-103, only portions of the modified system are re-processed. Other portions of the system are preserved and design results associated with the preserved portions of the system are reused. In this embodiment, procedures 104 and 105 may be performed on the modified design prior to performing procedures 101-103 on the modified system.

At 104, an analysis is performed to identify the differences between portions of the compiled design which have been synthesized, placed, and routed and the modified system which has yet to be synthesized, placed, and routed. It should be appreciated that a "portion" may describe an entire section or area of a system, one or more paths or a connection in the system, one or more components, nodes, or basic building blocks in the system, or other physical aspect of the system. According to an embodiment of the present invention, difference analysis is performed automatically by the EDA tool. The difference analysis may involve using a structural netlist differ procedure. The structural netlist differ procedure compares the netlist of the compiled system with the modified system for structural similarities and differences, unlike past procedure which relied only on a name or syntax comparison between netlists. According to an embodiment of the present invention, a database of information about the compiled system is generated. Subsequent compilation may access the database as a point of reference for current compiles of modified versions of the system. The difference analysis may be used to create a mapping between the netlist of the original system and the netlist of the modified system.

At 105, constraints are applied and/or a netlist is transformed in response to the difference analysis. After similarities and differences are identified between the original system and the modified system, portions of the modified system to preserve are determined. According to an embodiment of the present invention, portions of the modified system identified to be similar to the original system are automatically determined to be preserved. Alternatively, the portions of the modified system that are similar to the original system may be presented to a user to select for preservation. This may be achieved by use of a graphical user interface. According to an embodiment of the present invention, constraints are applied to one or more compilation procedures 101-103 to assist the compilation procedures to generate design results for the preserved portions that are similar to that of the original system. Alternatively, the very same design results from the original design may be used for design results for the preserved portions of the modified system. The netlist of the modified system may also be transformed at one or more compilation procedures 101-103 to reflect optimizations identified on the original system that may also be implemented on the modified system. Although FIG. 1 illustrates that constraints and/or transformations may be applied at synthesis 101, placement 102, and routing 103, the constraints and/or transformations may also be applied prior to placement 102 during pre-fitting and/or after routing during post-fitting.

As illustrated in FIG. 1, difference analysis 104 and the application of constraints/transformation of the netlist 105 may be performed during one or more of the synthesis 101, placement 102, and routing 103 procedures. For example, when being performed during placement 102 and routing 103, incremental design analysis 104 may compare design results or netlists generated from a prior procedure in the compilation flow of a modified system with corresponding design results from the original compiled design. The apply constraints/transform netlist 105 procedure returns constraints or netlist transformation to the one or more placement 102 and routing 103 procedures.

At 106, an assembly procedure is performed. The assembly procedure involves creating a data file that includes some of the information determined by the procedure described by 101-105. The data file may be a bit stream that may be used to program the target device. According to an embodiment of the present invention, the procedures illustrated in FIG. 1 may be performed by an EDA tool executed on a first computer system. The data file generated may be transmitted to a second computer system to allow the design of the system to be further processed. Alternatively, the data file may be transmitted to a second computer system which may be used to program the target device according to the system design. It should be appreciated that the design of the system may also be output in other forms such as on a display device or other medium.

Figure 2:
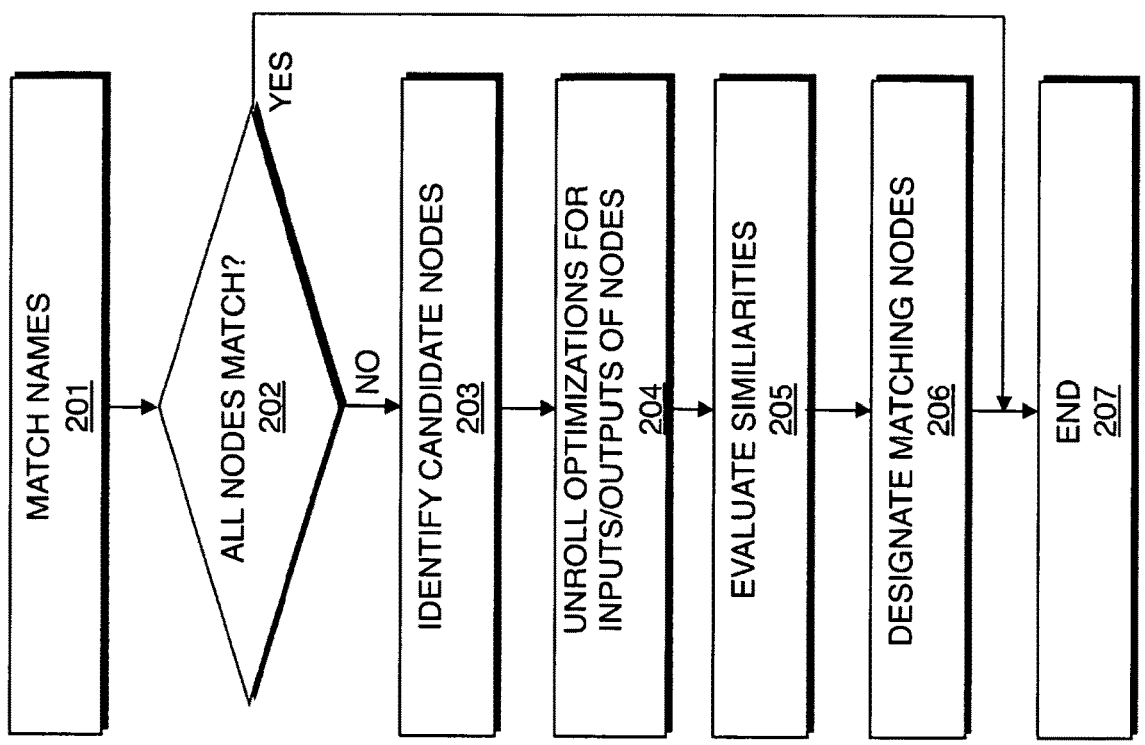
FIG. 2 is a flow chart illustrating a method for performing difference analysis according to an embodiment of the present invention.

FIG. 2 is a flow chart illustrating a method for performing difference analysis according to an embodiment of the present invention. The method illustrated in FIG. 2 may be used to implement the difference analysis procedure 104 illustrated in FIG. 1 in part. At 201, nodes in the compiled system and nodes in the modified system are matched by name. Nodes may refer to logic blocks, logic elements, or other components in a system. According to an embodiment of the present invention, the nodes may be first matched by matching names that are not changed by a synthesis procedure. For example, registers are nodes that are not changed by a synthesis procedure. Remaining nodes that have not been matched may be matched by matching names that may be changed by a synthesis procedure when the nodes are compatible. For example, combinational logic nodes are nodes that are changed by a synthesis procedure. Compatibility may be determined, for example, if two nodes have similar connectivity, ports, node type, or other criteria.

At 202, it is determined whether all the nodes in the modified system have been matched with nodes in the compiled system. If all of the nodes have been matched, control proceeds to 206. If not all of the nodes have been matched, control proceeds to 203. For each unmatched node in the modified system, procedures 203-206 may be performed.

At 203, candidate nodes for additional matching are identified. According to an embodiment of the present invention, candidate nodes are identified from fanins or fanouts of previously matched nodes at 201. Candidate nodes may also be identified as nodes having fanins or fanouts to candidate nodes that are matching.

At 204, optimizations associated with inputs and outputs of the candidate nodes of the compiled system are unrolled (reversed). According to an embodiment of the present invention, the optimizations may include LUT rotations, wire LUT insertions, node duplication, and other optimizations.

Figure 3:
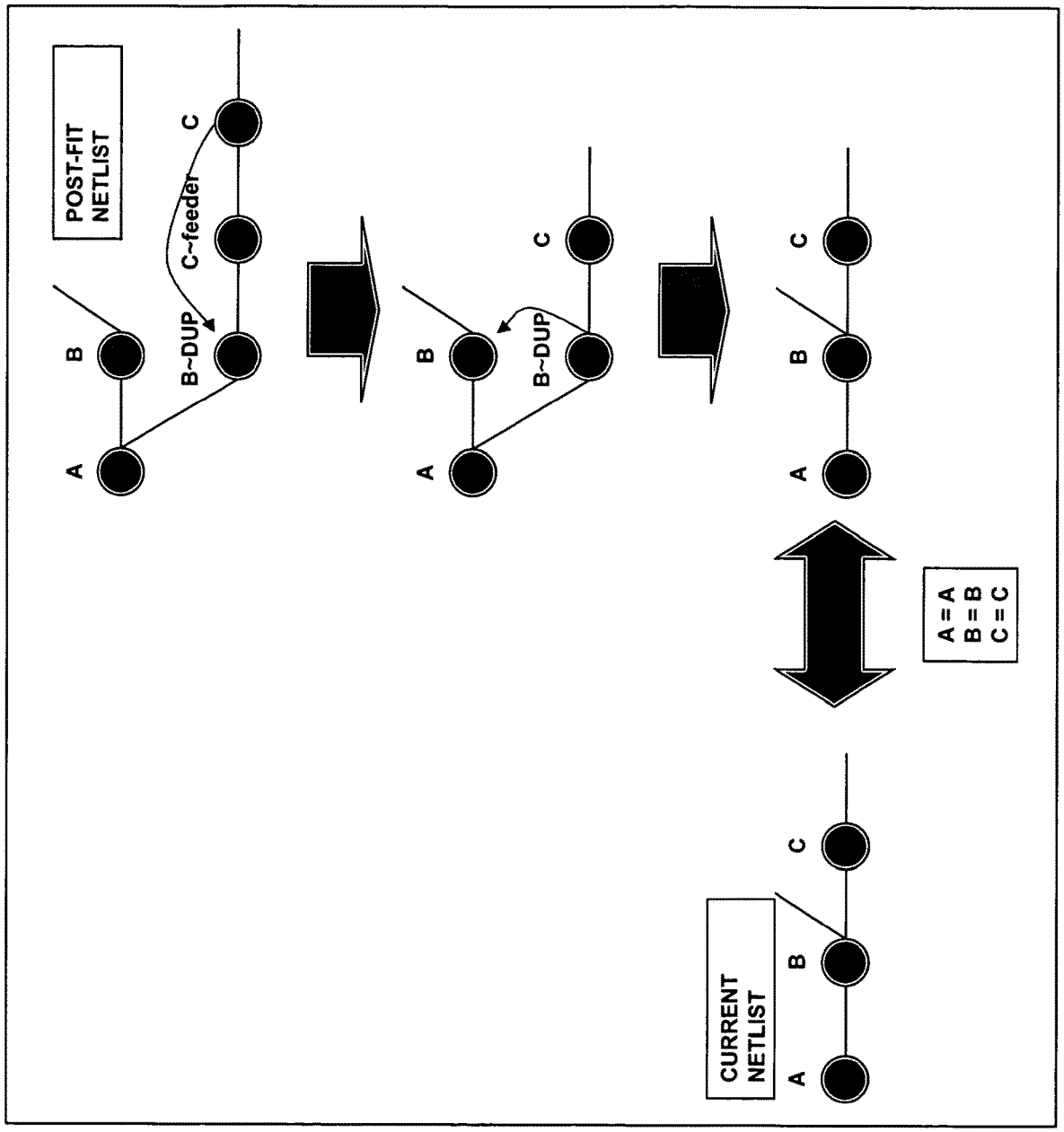
FIG. 3 illustrates an example of how optimizations are unrolled during difference analysis according to an embodiment of the present invention.

FIG. 3 illustrates an example of how optimizations are unrolled during difference analysis according to an embodiment of the present invention. A post-fit netlist for a compiled system includes a portion with nodes A, B, C, B~DUP, and C~feeder. As shown, node B~DUP represents a duplication of node B. C~feeder represents a wire LUT insertion between B~DUP and C. After reversing the insertion of wire LUT C~feeder and the duplication resulting in B~DUP, the portion of the design is determined to be equivalent to a portion of the current netlist from the modified system.

Referring back to FIG. 3, at 205, an evaluation is performed to determine the compatibility between the unmatched nodes in the modified system with corresponding unmatched nodes in the compiled system. According to an embodiment of the present invention, a number of criteria may be considered in the evaluation that relate to the structural characteristics of system around the unmatched nodes. The number of fanins and fanouts of the unmatched nodes may be considered. The type of fanin and fanout connections associated with the unmatched nodes may be considered. For example, fanin or fanout connections to matched nodes of the modified and compiled systems would indicate that there is a likelihood that the corresponding unmatched nodes are compatible. The hierarchy and unit names of the nodes may be considered. The port types of fanin and fanout connections associated with the candidate nodes may also be considered.

At 206, based on the evaluation performed at 205, matching nodes may be identified from the unmatched nodes evaluated. According to an embodiment of the present invention, a compatibility score may be generated for unmatched nodes in the compiled and modified system based on the criteria considered. The candidate node with the highest score is selected as a matching node.

At 207, control terminates the procedure.

FIGS. 1 and 2 are flow charts that illustrate embodiments of the present invention. Some of the techniques illustrated may be performed sequentially, in parallel or in an order other than that which is described and that the procedures described may be repeated. It should be appreciated that not all of the techniques described are required to be performed, that additional techniques may be added, and that some of the illustrated techniques may be substituted with other techniques.

Figure 4:
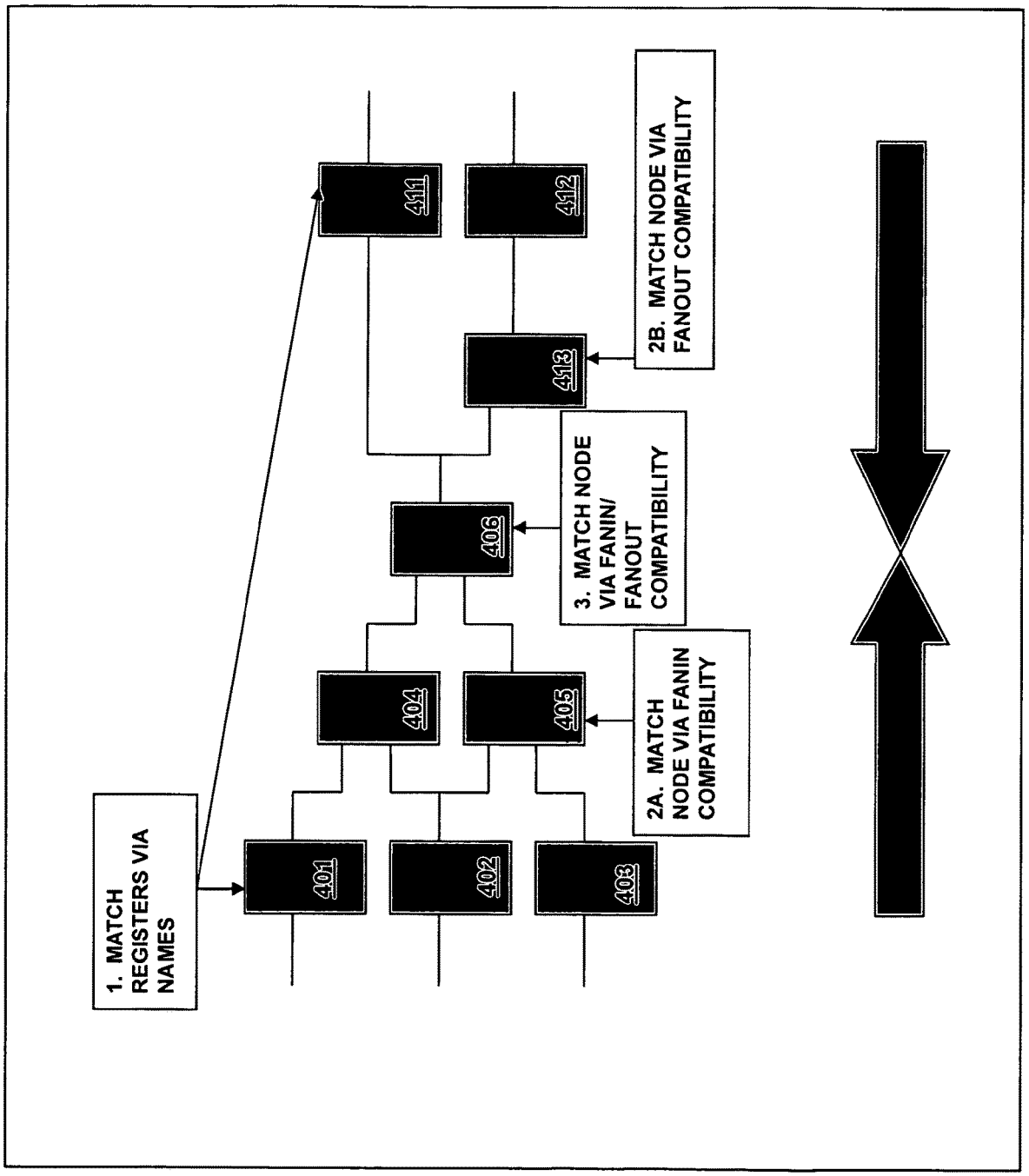
FIG. 4 illustrates an example of an iterative approach to matching logic implemented by difference analysis according to an embodiment of the present invention.

FIG. 4 illustrates an example of an iterative approach to matching logic implemented by difference analysis according to an embodiment of the present invention. During a first iteration, registers 401-403 and 411-412 in a modified system may be matched with corresponding registers from a compiled system based on the names of the registers. During a second iteration, nodes 404-405 in the modified system may be matched with corresponding nodes from a compiled system based on their number of fanins and the connectivity of the fanins to matched registers. Similarly during the second iteration, node 413 in the modified system may be matched with a corresponding node from a compiled system based on its number of fanouts and the connectivity of its fanout to a matched register. During a third iteration, node 406 in the modified system may be matched with a corresponding node from a compiled system based on its number of fanins and fanouts and the connectivity of its fanins and fanouts to nodes previously matched during the second iteration.

Figure 5:
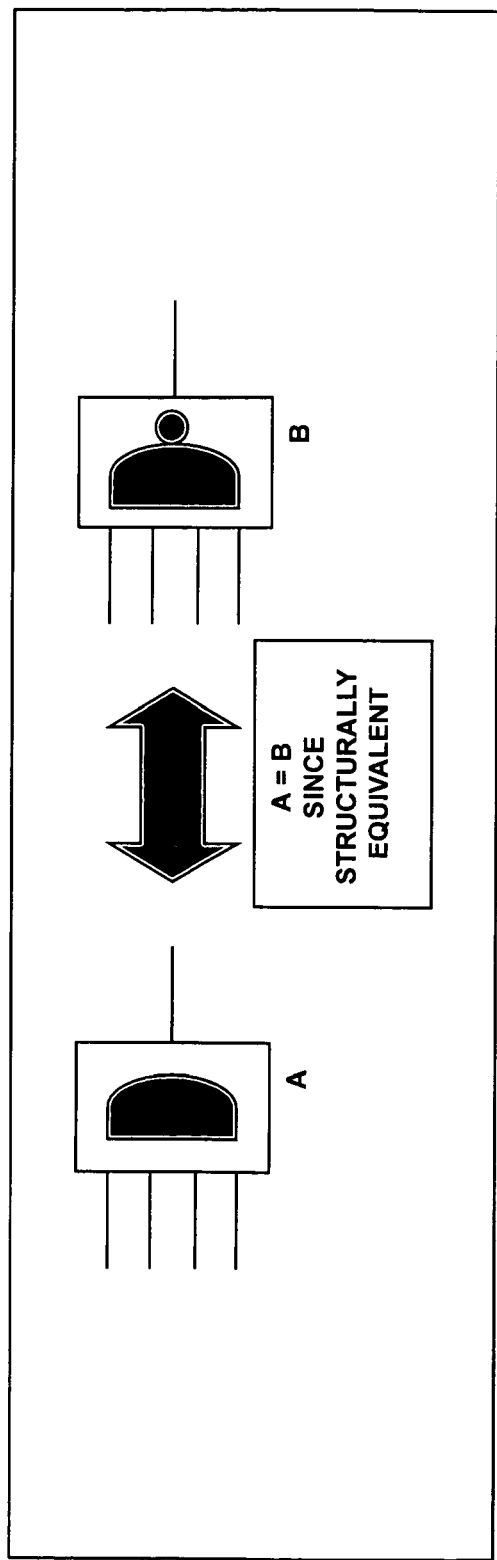
FIG. 5 illustrates an example of structural compatibility determined by difference analysis according to an embodiment of the present invention.

FIG. 5 illustrates an example of structural compatibility determined by difference analysis according to an embodiment of the present invention. FIG. 5 illustrates a component A from a compiled system and a component B from a modified system. After performing a difference analysis procedure which may consider the number of fanins and fanouts of the components and the connectivity to the fanins and fanouts of the components, it is determined that component A and B are structurally equivalent even though the components have a different LUTMASK and perform different functions.

Figure 6:
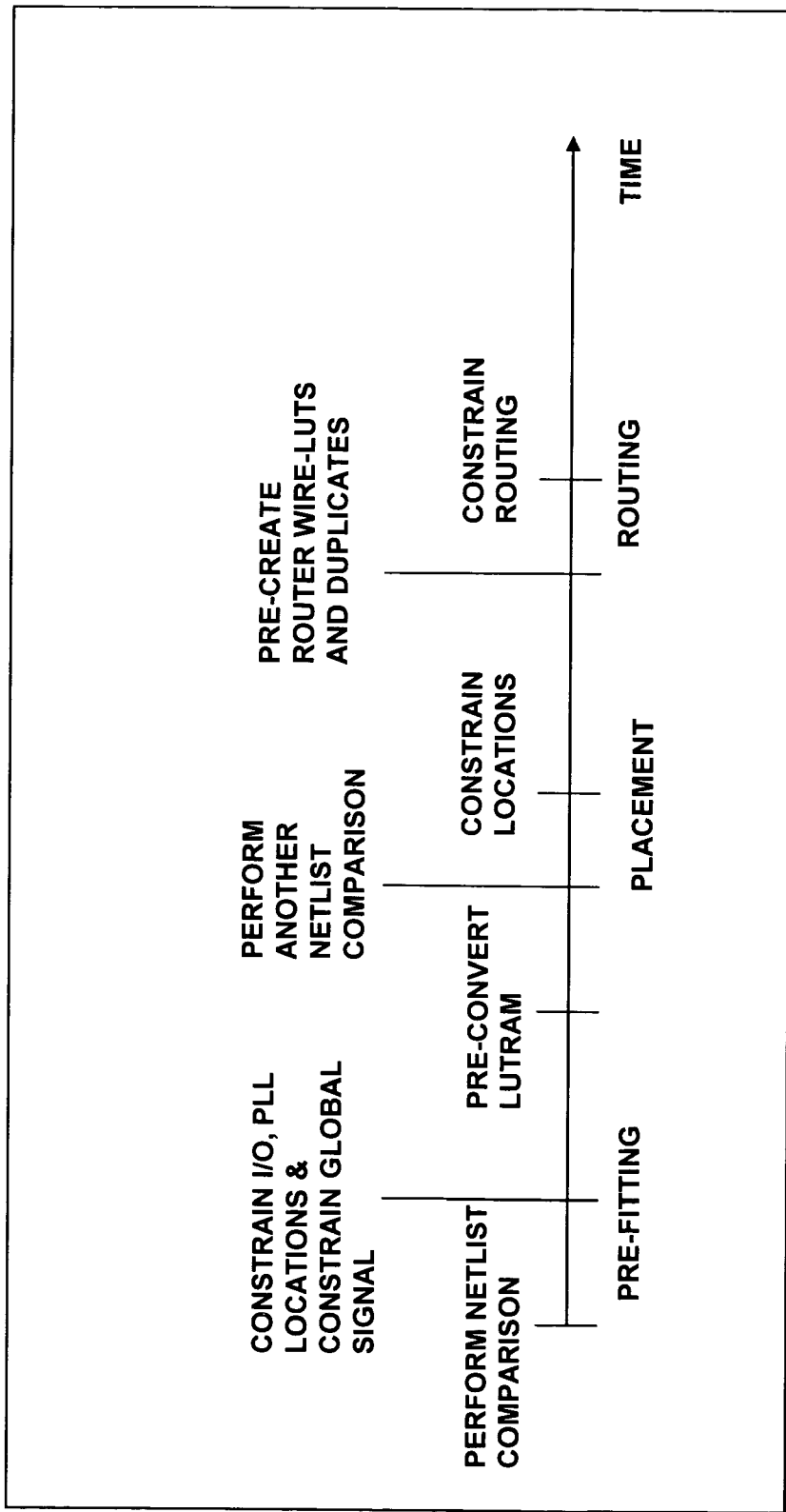
FIG. 6 illustrates exemplary operations performed during incremental compilation according to an embodiment of the present invention.

FIG. 6 illustrates exemplary operations performed during incremental compilation according to an embodiment of the present invention. Constraints for compilation and netlist transformations are applied to one or more compilation procedures over time. As illustrated, a netlist comparison is performed prior to pre-fitting. The netlist comparison includes the difference analysis as described with reference to 104 in FIG. 1. In response to the netlist comparison, constraints are applied to IO and PLL locations and assignment of global signals. The LUTRAM in the target device is also pre-converted. Prior to placement, another netlist comparison is performed. In response to the netlist comparison, constraints are applied to constrain locations of portions of modified system. Wire LUTs and component duplication are also pre-created prior to routing. Constraints are also applied to constrain routing.

Embodiments of the present invention reduce the development cycle of designing a system on a target device by reducing compile time and timing variability by guiding the compilation tool to achieve similar place and route result as a previous compile for unchanged or preserved portions of the system as reflected on the netlist while simultaneously fitting modified portions of the system. A difference analysis procedure compares the structural characteristics of a compiled system with a modified system as reflected in their netlists. This approach is less susceptible to issues experienced with synthesis node name changes which traditional node name based netlist difference procedure experience. Slight modifications made to netlists such as LUT mask changes are considered and may still be matched to portions in the compiled system. By evaluating structural characteristics of systems, the difference analysis procedure produces a larger percentage of matches and thus requires a smaller number of localized changes to be made during incremental compilation.

Embodiments of the present invention automatically generate constraints that are applied at various points in the compilation flow to guide the incremental compilation procedure to arrive at similar place and route results as the previous compilation for unchanged or preserved portions of the system. According to an embodiment of the present invention, the constraints are generated utilizing a database of previous compilation design results to create a mapping between the current netlist of the modified system and the previous netlist of the compiled system. That database may include information including placement, routing, high-speed low-power tile information, delay chains, global signal information, and fitter optimizations. The constraints that are generated may include location constraints and global signal and delay chain value assignments which are applied before fitting, and placement and routing constraints that are applied during fitting. The application of the constraints reduces timing variability between the compiled system and the modified system and reduces the compilation time of the modified system.

In addition to applying constraints, netlist transformations may be applied at various points in the incremental compilation flow to increase netlist compatibility. The netlist transformations improve netlist compatibility by guiding the fitter to a previous solution when applicable. For example, LUTRAM conversion may be performed before clustering, and wire LUTs and router duplication additions may be applied after placement and before routing.

Embodiments of the present invention also provide a designer (user) the opportunity to select portions of the modified system identified by the difference analysis procedure as matching the compiled system to reuse design results. This provides the user with a perspective of the design and may alert the user to unexpected results.

Figure 7:
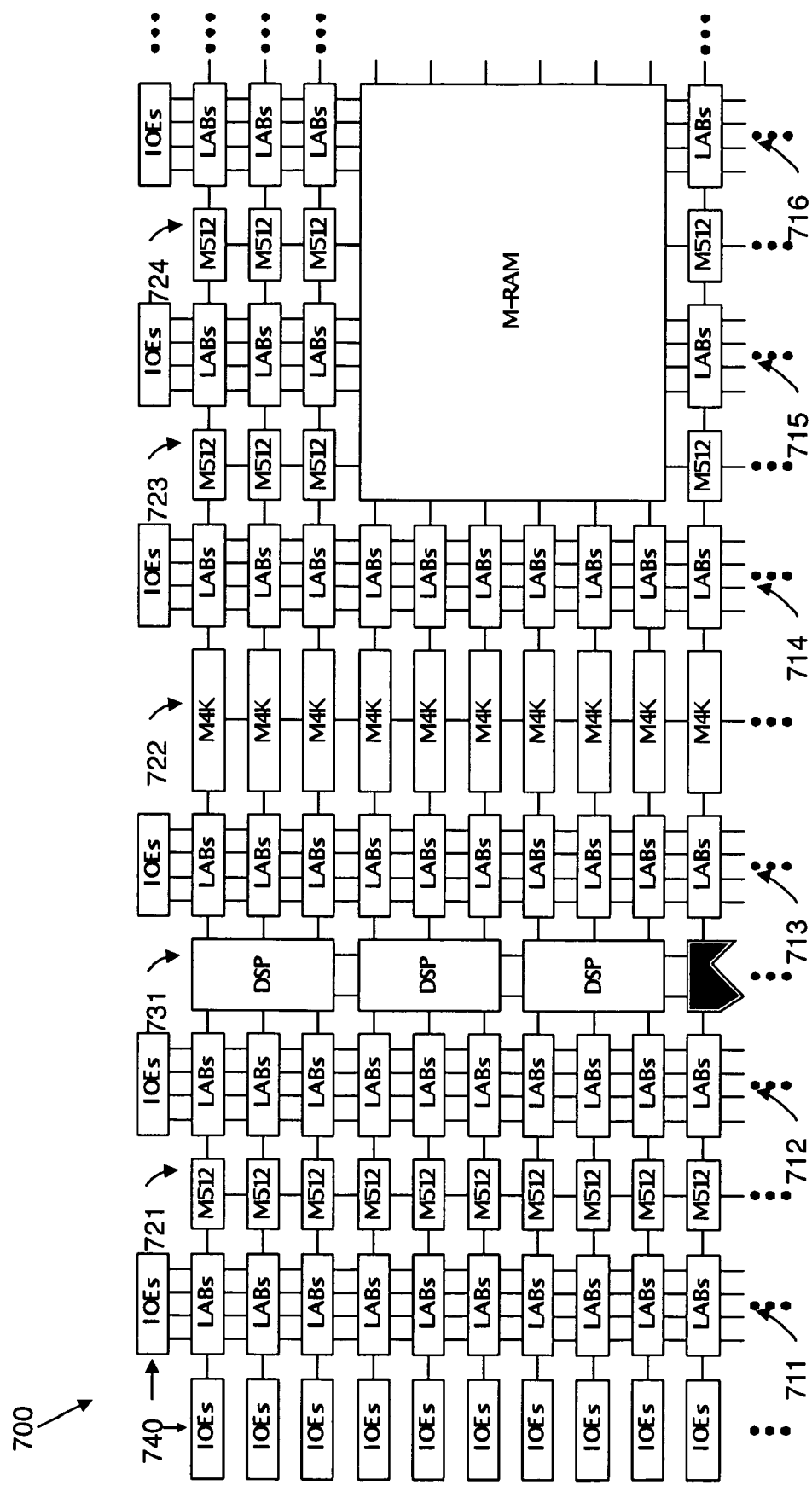
FIG. 7 illustrates an exemplary target device according to an embodiment of the present invention.

FIG. 7 illustrates a target device according to an embodiment of the present invention. The target device 700 includes a plurality of logic-array blocks (LABs). Each LAB may be formed from a plurality of logic blocks, carry chains, LAB control signals, (lookup table) LUT chain, and register chain connection lines. A logic block is a small unit of logic providing efficient implementation of user logic functions. A logic block includes one or more combinational cells, where each combinational cell has a single output, and registers. According to one embodiment of the present invention, the logic block may operate similarly to a logic element (LE), such as those found in the Stratix or Cyclone devices manufactured by Altera® Corporation, or a combinational logic block (CLB) such as those found in Virtex devices manufactured by Xilinx Inc. In this embodiment, the logic block may include a four input lookup table (LUT) with a configurable register. According to an alternate embodiment of the present invention, the logic block may operate similarly to an adaptive logic module (ALM), such as those found in Stratix devices manufactured by Altera Corporation. LABs are grouped into rows and columns across the target device 700. Columns of LABs are shown as 711-716.

It should be appreciated that the logic block may include additional or alternate components.

The target device 700 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the target device in between selected LABs or located individually or in pairs within the target device 700. Columns of memory blocks are shown as 721-724.

The target device 700 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the target device 700 and are shown as 731.

The target device 700 includes a plurality of input/output elements (IOEs) 740. Each IOE feeds an IO pin (not shown) on the target device 700. The IOEs 740 are located at the end of LAB rows and columns around the periphery of the target device 700. Each IOE may include a bidirectional IO buffer and a plurality of registers for registering input, output, and output-enable signals.

The target device 700 may include routing resources such as LAB local interconnect lines, row interconnect lines ("H-type wires"), and column interconnect lines ("V-type wires") (not shown) to route signals between components on the target device.

FIG. 7 illustrates an exemplary embodiment of a target device. It should also be appreciated that, as indicated above, the target device may include the same or different semiconductor devices arranged in a different manner. The target device 700 may also include FPGA resources other than those described and illustrated with reference to the target device illustrated in FIG. 7. Thus, while embodiments of the invention described herein may be utilized on the architecture described in FIG. 7, it should be appreciated that it may also be utilized on different architectures.

Figure 8:
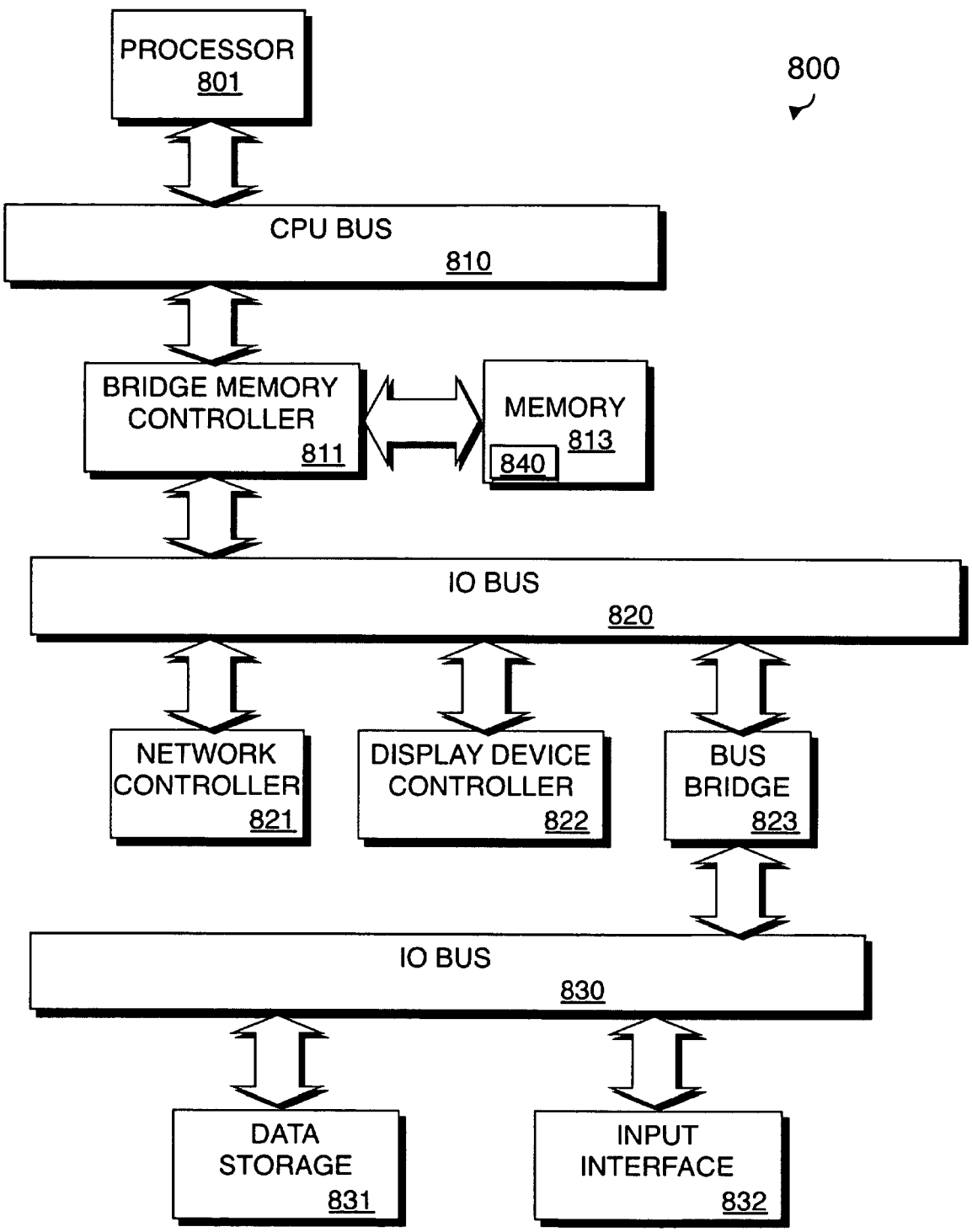
FIG. 8 illustrates a computer system on which a system designer resides according to an embodiment of the present invention.

FIG. 8 is a block diagram of an exemplary computer system 800 in which an example embodiment of the present invention resides. The computer system 800 includes a processor 801 that processes data signals. The processor 801 is coupled to a CPU bus 810 or other switch fabric that transmits data signals to other components in the computer system 800.

The computer system 800 includes a memory 813. The memory 813 may store instructions and code represented by data signals that may be executed by the processor 801. A bridge memory controller 811 is coupled to the CPU bus 810 and the memory 813. The bridge memory controller 811 directs data signals between the processor 801, the memory 813, and other components in the computer system 800 and bridges the data signals between the CPU bus 810, the memory 813, and a first IO bus 820. According to an embodiment of the present invention, the processor 801 may be directly coupled to the memory 813 and communicates with the memory 813 without a bridge memory controller 811.

The first IO bus 820 may be a single bus or a combination of multiple buses. The first IO bus 820 provides communication links between components in the computer system 800. A network controller 821 is coupled to the first IO bus 820. The network controller 821 may link the computer system 800 to a network of computers (not shown) and supports communication among the machines. A display device controller 822 is coupled to the first IO bus 820. The display device controller 822 allows coupling of a display device (not shown) to the computer system 800 and acts as an interface between the display device and the computer system 800.

A second IO bus 830 may be a single bus or a combination of multiple buses. The second IO bus 830 provides communication links between components in the computer system 800. A data storage device 831 is coupled to the second IO bus 830. An input interface 832 is coupled to the second IO bus 830. The input interface 832 allows coupling of an input device to the computer system 800 and transmits data signals from an input device to the computer system 800. A bus bridge 823 couples the first IO bus 820 to the second IO bus 830. The bus bridge 823 operates to buffer and bridge data signals between the first IO bus 820 and the second IO bus 830. It should be appreciated that computer systems having a different architecture may also be used to implement the computer system 800.

A system designer 840 may reside in memory 813 and be executed by the processor 801. The system designer 840 may operate to synthesize a system, place the system on a target device, route the system on the target device, and assemble the system. The system designer 840 may also operate to perform a difference analysis procedure to identify differences between a first system and a second system for incremental compilation. According to an embodiment of the present invention, the difference analysis procedure involves comparing the structural characteristics of portions of the first system and the second system. The structural characteristics may include the number of fanins and fanouts of nodes in the system, and the connectivity of the fanins and fanouts. The difference analysis procedure may also unroll optimizations made to the first system during a previous compile to better perform a better comparison between the first system and the second system. The difference analysis procedure may also present a designer (user) with the identity of portions of the second system that are believed to match portions of the first system. The user may be allowed to select which portions of the second system are to reuse design results from the first system.

Figure 9:
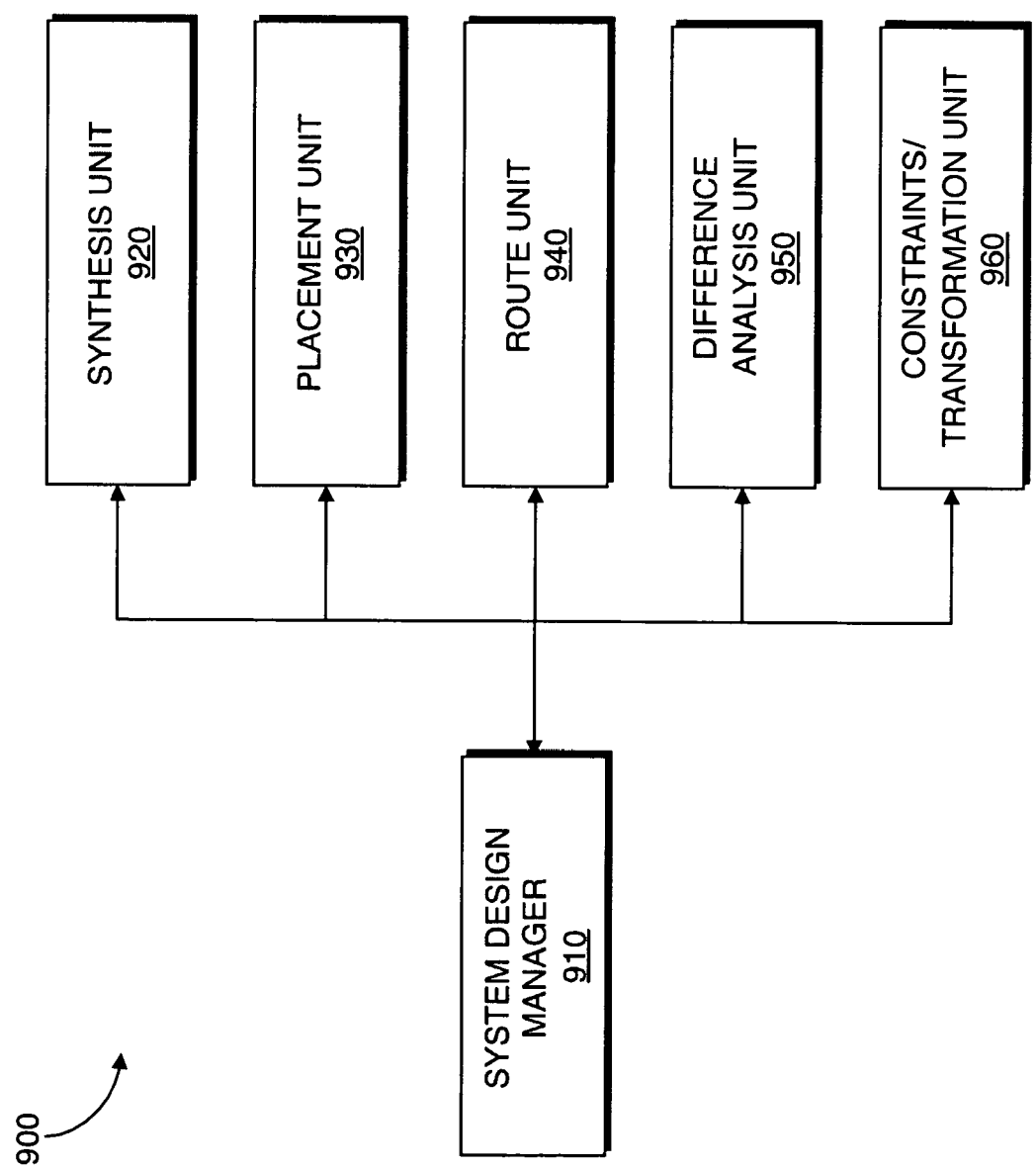
FIG. 9 illustrates a system designer according to an embodiment of the present invention.

FIG. 9 illustrates a system designer 900 according to an embodiment of the present invention. The system designer 900 may be an EDA tool and be used to implement the system designer 840 illustrated in FIG. 8. FIG. 9 illustrates software modules implementing an embodiment of the present invention. According to one embodiment, system design may be performed by a computer system (not shown) executing sequences of instructions represented by the software modules shown in FIG. 9. Execution of the sequences of instructions causes the computer system to support system design as will be described hereafter. In alternate embodiments, hard-wired circuitry may be used in place of or in combination with software instructions to implement the present invention. Thus, the present invention is not limited to any specific combination of hardware circuitry and software. The system designer 900 includes a system designer manager 910. The system designer manager 910 is coupled to and transmits information between components in the system designer 900.

The system designer 900 includes a synthesis unit 920. The synthesis unit 920 generates a logic design of a system to be implemented by a target device. According to an embodiment of the system designer 900, the synthesis unit 920 takes a conceptual Hardware Description Language (HDL) design definition and generates an optimized logical representation of the system. The optimized logical representation of the system generated by the synthesis unit 920 may include a representation that has a minimized number of functional blocks and registers, such as logic gates and logic elements, required for the system. Alternatively, the optimized logical representation of the system generated by the synthesis unit 920 may include a representation that has a reduced depth of logic and that generates a lower signal propagation delay. The synthesis unit 920 also determines how to implement the functional blocks and registers in the optimized logic representation utilizing specific resources on a target device, thus creating an optimized post-synthesis netlist for each of the partitions in the system. The post-synthesis netlist indicate how the resources on the target device can be utilized to implement the system. The post-synthesis netlist may, for example, include components such as LEs on the target device.

The system designer 900 includes a placement unit 930. The placement unit 930 fits the system on the target device by determining which resources on the target device are to be used for specific functional blocks and registers. According to an embodiment of the system designer 930, the placement unit 930 first determines how to implement portions of the optimized logic design in clusters. Clusters may represent a proper subset of the components on the target device such as, for example, a LAB having a plurality of logic blocks. In this embodiment, after portions of the optimized logic design are implemented in clusters, the clusters may be placed by assigning the clusters to specific LABs on the target device.

The system designer 900 includes a routing unit 940. The routing unit 940 determines the routing resources on the target device to use to provide interconnection between the functional blocks and registers on the target device.

The system designer 900 includes a difference analysis unit 950. The difference analysis unit 950 identifies the differences between portions of the compiled system which have been synthesized, placed, and routed and a modified system which has yet to be synthesized, placed, and routed. It should be appreciated that a "portion" may describe an entire section or area of a system, a path or a connection in the system, a component or a basic building block in the system, or other physical aspect of the system. According to an embodiment of the present invention, the difference analysis unit 950 compares the netlist of the compiled system with the modified system for structural similarities and differences, unlike past procedure which relied only on a name or syntax comparison between netlists. According to an embodiment of the present invention, a database of information about the compiled system is generated. Subsequent compilation may access the database as a point of reference for current compiles of modified versions of the system. The difference analysis may be used to create a mapping between the netlist of the original system and the netlist of the modified system. The difference analysis unit 950 may perform the procedures described with reference to FIG. 2.

After similarities and differences between the compiled system and the modified system are identified, portions of the modified system to preserve are determined. According to an embodiment of the present invention, portions of the modified system identified to be similar to the original system are automatically determined to be preserved. Alternatively, the portions of the modified system that are similar to the original system may be presented by the system design manager 910 to a user to select for preservation.

The system designer 900 includes a constraints/transformation unit 960. The constraints/transformation unit 960 applies constraints to one or more compilation procedures performed by synthesis unit 920, placement unit 930, and routing unit 940 to assist in generating design results for the preserved portions that are similar to that of the original system. Alternatively, the very same design results from the original design may be used for design results for the preserved portions of the modified system. The netlist of the modified system may also be transformed to reflect optimizations identified on the original system that may also be implemented on the modified system.

According to an embodiment of the system designer 900, the system design manager 910 performs an assembly procedure that creates a data file that includes the design of the system generated by the system designer 900. The data file may be a bit stream that may be used to program the target device. The system design manager 910 may output the data file so that the data file may be stored or alternatively transmitted to a separate machine used to program the target device. It should be appreciated that the system design manager 910 may also output the design of the system in other forms such as on a display device or other medium.

Embodiments of the present invention may be provided as a computer program product, or software, that may include an article of manufacture on a machine accessible, machine/computer-readable medium having instructions. The instructions on the machine accessible or machine/computer-readable medium may be used to program a computer system or other electronic device. The medium may include, but is not limited to, floppy diskettes, optical disks, CD-ROMs, and magneto-optical disks or other type of media/machine-readable medium suitable for storing electronic instructions. The techniques described herein are not limited to any particular software configuration. They may find applicability in any computing or processing environment. The terms "machine accessible medium", "machine readable medium", or "computer-readable medium" used herein shall include any medium that is capable of storing or encoding a sequence of instructions for execution by the machine and that cause the machine to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

In the foregoing specification, embodiments of the invention have been described with reference to specific exemplary embodiments thereof. It will, however, be evident that various modifications and changes may be made thereto without departing from the broader spirit and scope of the embodiments of the invention. The specification and drawings are, accordingly, to be regarded in an illustrative rather than a restrictive sense.

What is claimed is:

1. A system, comprising:
a tangible, non-transitory, and machine-readable medium, comprising machine-readable instructions stored thereon that, when executed, cause a processor to:
compare a first netlist and a second netlist to determine a matching subset of cells between the first netlist and the second netlist, wherein the first netlist corresponds to a previously optimized netlist for a first hardware description language design, wherein the second netlist corresponds to a second hardware description language design having one or more portions different from the first hardware description language design, and wherein the comparison is based at least in part on a routing of fanouts between the cells;
identify a portion of the first netlist as matching based at least in part on the matching subset of the cells;
generate a programmable logic circuit placement for the second netlist at least in part by reusing placement of the portion of the first netlist identified as matching; and
generate a bit stream based at least in part on the programmable logic circuit placement, wherein the bit stream is configured to cause programming of the second hardware description language design into components of a programmable logic; and
a field programmable gate array configured to be programmed to implement the second hardware description language design based at least in part on the bit stream generated in response to operations performed to identify the portion of the first netlist eligible to be reused.

2. The system of claim 1, wherein the machine-readable instructions that, when executed, cause the processor to determine the matching subset of the cells between the first netlist and the second netlist also comprise instructions that cause the processor to determine the matching subset of the cells based at least in part on a comparison between a first fanout of the first netlist and a second fanout of the second netlist, wherein the first fanout comprises a first routing segment into a second routing segment and a third routing segment.

3. The system of claim 1, wherein the machine-readable instructions that, when executed, cause the processor to generate the bit stream based at least in part on the programmable logic circuit placement also comprise instructions that cause the processor to perform one or more incremental placements and routings based at least in part on the matching subset of the cells.

4. The system of claim 1, wherein the machine-readable instructions that, when executed, cause the processor to identify the portion of the first netlist for reuse based at least in part on the matching subset of the cells also comprise instructions that cause the processor to identify the portion of the first netlist for reuse at least partially simultaneous to another operation.

5. The system of claim 1, wherein the machine-readable instructions that, when executed, cause the processor to determine the matching subset of the cells between the first netlist and the second netlist also comprise instructions that cause the processor to identify the matching subset of the cells based at least in part on pins between the first netlist and the second netlist.

6. The system of claim 1, wherein the machine-readable instructions that, when executed, cause the processor to generate the programmable logic circuit placement for the second netlist at least in part by reusing the portion of the first netlist also comprise instructions that cause the processor to generate the programmable logic circuit placement for the second netlist without repeating a physical optimization of the portion of the first netlist eligible to be reused.

7. The system of claim 1, wherein the portion of the first netlist is identified based at least in part on a placement of a first routing segment relative to a second routing segment.

\* \* \* \* \*